(12) United States Patent
Kwon et al.

(10) Patent No.: US 8,641,404 B2
(45) Date of Patent: Feb. 4, 2014

(54) OPTOFLUIDIC LITHOGRAPHY SYSTEM, METHOD OF MANUFACTURING TWO-LAYERED MICROFLUID CHANNEL, AND METHOD OF MANUFACTURING THREE-DIMENSIONAL MICROSTRUCTURES

(75) Inventors: Sunghoon Kwon, Seoul (KR); SeungAh Lee, Gyeonggi-do (KR); Wook Park, Seoul (KR); Su Eun Chung, Seoul (KR)

(73) Assignee: SNU R&DB Foundation, Seoul (KR)

( * ) Notice: Subject to any disclaimer, the term of this patent is extended or adjusted under 35 U.S.C. 154(b) by 0 days.

(21) Appl. No.: 13/554,288

(22) Filed: Jul. 20, 2012

(65) Prior Publication Data

US 2013/0176543 A1   Jul. 11, 2013

Related U.S. Application Data

(63) Continuation of application No. 12/555,428, filed on Sep. 8, 2009, now Pat. No. 8,246,889.

(30) Foreign Application Priority Data

Sep. 9, 2008   (KR) .................. 10-2008-0088683

(51) Int. Cl.
    *B28B 7/30* (2006.01)
(52) U.S. Cl.
    USPC .............. 425/326.1; 264/314; 264/313
(58) Field of Classification Search
    USPC .............. 264/496, 313, 314; 425/326.1
    See application file for complete search history.

(56) References Cited

U.S. PATENT DOCUMENTS

| 3,883,629 | A | 5/1975 | Garner et al. |
| 6,660,192 | B1 | 12/2003 | Kim et al. |
| 2007/0105972 | A1 | 5/2007 | Doyle et al. |
| 2007/0114686 | A1 | 5/2007 | Choi et al. |

OTHER PUBLICATIONS

Hunt et al., "Optofluidic integration for microanalysis", Microfluid Nanofluid, 2008;vol. 4. 53-79.
Chung et al., "Optofluidic maskless lithography system for . . . microstructures in microfluidic channels", Applied physics letters, 2007; vol. 91. (041106) 1-3.
Yun et al., "A Microfluidic Chip for measurement of biomolecules . . . quantum dot fluorescence assay", Measurement Science and Technology, 2006; vol. 17, 3178-3183.
Deridukuri et al., "Stop flow litography in a microfluidic device", May 21, 2007, Lab Chip, 2007, 7, 818-828.
Dhananjay Dendukuri et al., "Continuous-flow lithography for high-throughput microparticle synthesis," Nature materials, vol. 5, May 2006.

*Primary Examiner* — Galen Hauth
(74) *Attorney, Agent, or Firm* — Sherr & Jiang, PLLC

(57) ABSTRACT

An optofluidic lithography system including a membrane, a microfluidic channel, and a pneumatic chamber is provided. The membrane may be positioned between a pneumatic chamber and a microfluidic channel. The microfluidic channel may have a height corresponding to a displacement of the membrane and have a fluid flowing therein, the fluid being cured by light irradiated from the bottom to form a microstructure. The pneumatic chamber may induce the displacement of the membrane depending on an internal atmospheric pressure thereof.

6 Claims, 9 Drawing Sheets

(i)

(ii)

(iii)

OPTOFLUIDIC LITHOGRAPHY SYSTEM, METHOD OF MANUFACTURING TWO-LAYERED MICROFLUID CHANNEL, AND METHOD OF MANUFACTURING THREE-DIMENSIONAL MICROSTRUCTURES

The present application is a Continuation Application of co-pending U.S. patent application Ser. No. 12/555,428 (filed on Sep. 8, 2009) under 35 U.S.C. §120, which claims priority to Korean Patent Application No. 10-2008-0088683 (filed on Sep. 9, 2008) under 35 U.S.C. §119, which are all hereby incorporated by reference in their entirety.

TECHNICAL FIELD

The described technology relates to an optofluidic lithography system, a method of manufacturing a two-layered microfluidic channel, and a method of manufacturing three-dimensional microstructures.

BACKGROUND

Fine structures such as microstructures and nanostructures may be applied to various fields such as photonic materials, micro-electromechanical systems (MEMS), biomaterials, self-assembly and so on. Recently, as a technique for producing such fine structures, continuous-flow lithography has been proposed (D. Dendukuri, D. Pregibon, J. Collins, T. Hatton, P. Doyle. "Continuous-flow lithography for high-throughput microparticle synthesis." Nature materials, vol. 5, pp. 365-369, 2006; U.S. Patent No. 2007-0105972, Microstructure synthesis by flow lithography and polymerization). The continuous-flow lithography involves flowing a photocurable fluid into a microfluidic channel, exposing the photocurable fluid to a predetermined shape of light to selectively cure the photocurable fluid, and continuously producing various kinds of free-floating microstructures. When the continuous-flow lithography is used, microstructures having various shapes, sizes, and chemical compositions can be produced more quickly and easily.

However, the continuous-flow lithography proposed in the above paper can produce only single-layered microstructures. Therefore, it is difficult to produce three-dimensional microstructures with a complex structure. Further, the continuous-flow lithography proposed in the above paper, uses a photomask, which is not programmable in real time. Therefore, the continuous-flow lithography has a limited time-and-space flexibility in producing microstructures.

SUMMARY

In one exemplary embodiment, an optofluidic lithography system is provided. The optofluidic lithography system includes a membrane, a microfluidic channel, and a pneumatic chamber. The membrane is positioned between a pneumatic chamber and a microfluidic channel. The microfluidic channel has a height corresponding to a displacement of the membrane and a fluid flowing therein. The fluid is cured by light irradiated from the bottom to form a microstructure. The pneumatic chamber induces the displacement of the membrane depending on an internal atmospheric pressure thereof.

In another exemplary embodiment, a method of manufacturing a two-layered microfluidic channel is provided. A pneumatic-chamber mold is placed on a wafer, and PDMS is poured into a pneumatic-chamber mold. The wafer and the pneumatic-chamber mold are removed, and a hole is bored through the PDMS covering the pneumatic-chamber mold such that a tube for injecting or discharging air into or from a pneumatic chamber can be inserted. The intermediate product having gone through the placing PDMS on the pneumatic-chamber mold is placed on the intermediate product having gone through the placing PDMS on the microfluidic-channel mold, and both of the PDMS are attached to each other to form a pneumatic chamber. The microfluidic-channel mold is removed. A hole is bored through the PDMS covering the microfluidic-channel mold such that a tube for injecting or discharging a fluid into or from a microfluidic channel can be inserted. The wafer is removed, and a light transmitting substrate is attached to the bottom to form the microfluidic channel. A fluid is injected into the microfluidic channel.

In still another exemplary embodiment, a method of manufacturing three-dimensional microstructures is provided. A fluid is injected into a microfluidic channel positioned in a lower portion of a two-layered microfluidic channel. Air is injected into or discharged from a pneumatic chamber above the microfluidic channel to deform a membrane formed between the microfluidic channel and the pneumatic chamber such that the height of the microfluidic channel is adjusted. Light is irradiated into the microfluidic channel to cure the fluid, thereby forming a layer on a substrate.

In still another exemplary embodiment, a method of manufacturing three-dimensional microstructures is provided. A fluid is injected into a microfluidic channel positioned in a lower portion of a two-layered microfluidic channel. Air is injected into or discharged from a pneumatic chamber positioned above the microfluidic channel to deform a membrane formed between the microfluidic channel and the pneumatic chamber such that the height of the microfluidic channel is adjusted. Light is irradiated into the microfluidic channel to cure the fluid such that a layer is formed on a substrate. A cleaning solution is flowed into the microfluidic channel to wash out the remaining fluid. An internal atmospheric pressure of the pneumatic chamber is decreased to increase the height of the microfluidic channel. Light is irradiated into the microfluidic channel to form a new layer on the layer formed on the substrate, while flowing a different fluid into the microfluidic channel.

BRIEF DESCRIPTION OF THE DRAWINGS

The above and other features and advantages of the present disclosure will become more apparent to those of ordinary skill in the art by describing in detail exemplary embodiments thereof with reference to the attached drawings, in which.

DETAILED DESCRIPTION

Figure 1:
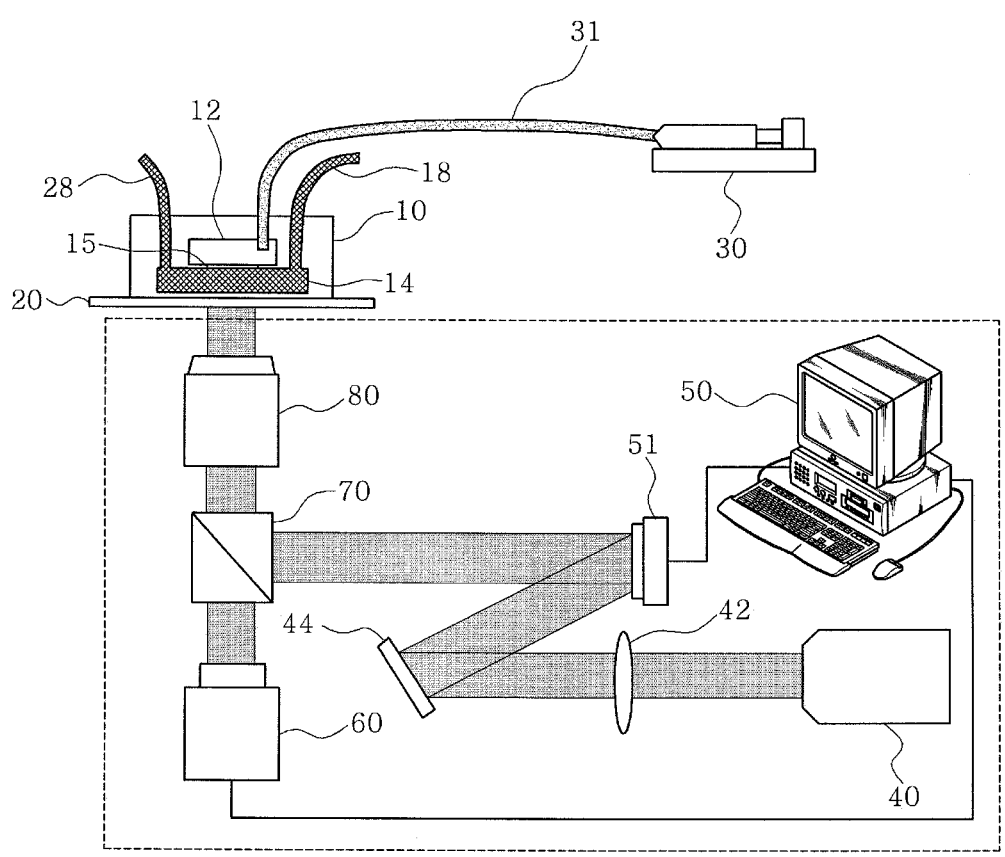
FIG. 1 is a diagram for explaining an optofluidic lithography system according to an exemplary embodiment of this disclosure.

It will be readily understood that the components of the present disclosure, as generally described and illustrated in the Figures herein, could be arranged and designed in a wide variety of different configurations. Thus, the following more detailed description of the exemplary embodiments of an apparatus and method in accordance with the present disclosure, as represented in the Figures, is not intended to limit the scope of the disclosure, as claimed, but is merely representative of certain examples of embodiments in accordance with the disclosure. The presently described exemplary embodiments will be best understood by reference to the drawings, wherein like parts are designated by like reference numerals throughout. Moreover, the drawings are not necessarily to scale, and the size and relative sizes of the layers and regions may have been exaggerated for clarity.

It will also be understood that when an element or layer is referred to as being "on," another element or layer, the element or layer may be directly on the other element or layer or intervening elements or layers may be present.

FIG. 1 is a diagram for explaining an optofluidic lithography system according to an exemplary embodiment of this disclosure.

Referring to FIG. 1, the optofluidic lithography system includes a two-layered microfluidic channel 10.

The two-layered microfluidic channel 10 includes a pneumatic chamber 12, a membrane 15, and a microfluidic channel 14. The pneumatic chamber 12 is connected to an air injection pump 30 through a tube 31. Through the tube 31, air is injected into the pneumatic chamber 12 from the air injection pump 30 or discharged from the pneumatic chamber 12. Through this process, it is possible to adjust the internal atmospheric pressure of the pneumatic chamber 12. A material surrounding the pneumatic chamber 12 may be polydimethylsiloxane (PDMS).

Under the pneumatic chamber 12, a membrane 15 is provided. The membrane 15 is deformed depending on the internal atmospheric pressure of the pneumatic chamber 12. As the internal atmospheric pressure of the pneumatic chamber 12 increases, the membrane 15 is swollen toward the microfluidic channel 14. On the other hand, as the internal atmospheric pressure of the pneumatic chamber 12 decreases, the membrane 15 is swollen toward the pneumatic chamber 12. The membrane 15 may be formed of PDMS, which has an oxygen-transmitting property. Therefore, it is possible to prevent a situation in which an oxygen layer is formed on the surface of the membrane 15 and a photocurable fluid cured by light adheres to the membrane 15.

Under the membrane 15, the microfluidic channel 14 is provided. The microfluidic channel 14 may be connected to a fluid injection tube 18, through which a fluid 11 is injected into the microfluidic channel 14, and a fluid discharge tube 28 through which the fluid 11 is discharged from the microfluidic channel 14, for example. Inside the microfluidic channel 14, the fluid 11 flows. As the fluid 11, a photocurable fluid may be used, for example. The photocurable fluid is cured, depending on light provided to the microfluidic channel, and then output. More specifically, while the photocurable fluid is exposed to light inside the microfluidic channel 14, it is cured to produce microstructures. The height of the microfluidic channel 14 is determined by a displacement of the membrane 15. When the internal atmospheric pressure of the pneumatic chamber 12 increases so that the membrane 15 is swollen toward the microfluidic channel 14, the height of the microfluidic channel 14 decreases. On the other hand, when the internal atmospheric pressure of the pneumatic chamber 12 decreases so that the membrane 15 is swollen toward the pneumatic chamber 12, the height of the microfluidic channel 14 increases. A material surrounding the microfluidic channel other than the bottom thereof may be PDMS.

Under the microfluidic channel 14, a substrate 20 is provided. The substrate 20 may be a glass substrate, for example. On the substrate 20, the fluid cured through the exposure to light forms a layer. Through the lower surface of the substrate 20, light is irradiated to cure the fluid.

The optofluidic lithography system according to an exemplary embodiment of this disclosure may further include a light source 40, a spatial light modulator 51, and a demagnification lens 80, in addition to the two-layered microfluidic channel 10. Further, the optofluidic lithography system may include a beam splitter 70 and a camera 60 which are required for monitoring the microfluidic channel 14.

The light source 40 serves to provide light capable of curing a photocurable fluid 41 flowing in the microfluidic channel 14 to the spatial light splitter 51. The light source 40 may be an ultraviolet light source, for example. Otherwise, the light source 40 may be an X-ray, visible light, or infrared light source depending on the type of photocurable fluid. The light source 40 may include an ultraviolet light source collimator 42 and a mirror 44. The ultraviolet light source collimator 42 serves to output parallel ultraviolet light. The mirror 44 serves to provide the light output from the ultraviolet light source collimator 42 to the spatial light modulator 51.

The spatial light modulator 51 serves to modulate the light provided from the light source 40. FIG. 1 illustrates a digital micromirror device. The spatial light modulator 51 may be manufactured in a two-dimensional array or one-dimensional array type. Further, a device other than the micromirror, such as a liquid crystal display (LCD), may be used to manufacture the spatial light modulator 51. In the spatial light modulator 51, light modulation can be programmed. That is, the spatial light modulator 51 can selectively deliver light that is incident on a desired pixel among pixels included in the spatial light modulator 51 to the demagnification lens 80 at a desired time. The light modulation of the spatial light modulator 51 may be controlled by a computer 50, for example. That is, images produced by the computer 50 are delivered to the programmable spatial light modulator 51, and the spatial light modulator 51 controls the shape of light provided to the microfluidic channel 14. The shape of microstructures produced in the microfluidic channel 14 can be controlled by the programmable spatial light modulator 51.

The demagnification lens 80 serves to demagnify the modulated light provided from the spatial light modulator 51 to provide to the microfluidic channel 14. As the demagnification lens 80, a microscope object lens 10x may be used to project an image of the spatial light modulator 51 onto a final object plane at a demagnification factor of about 8.9, for example.

The beam splitter 70 serves to deliver the modulated light provided from the spatial light modulator 51 to the microfluidic channel 14 through the demagnification lens 80. Further, the beam splitter 70 serves to deliver an image from the microfluidic channel 14 to the camera 60 through the demagnification lens 80. The beam splitter 80 may be a dichroic mirror as shown in FIG. 1, for example.

The camera 60 outputs an electrical image signal corresponding to the image of the microfluidic channel 14. The camera 60 may be a charge-coupled device (CCD), for example.

Since the optofluidic lithography system shown in FIG. 1 employs the two-layered microfluidic channel capable of adjusting the height of the microfluidic channel, the scale of the system can be reduced. Further, the number of manufacturing processes and the manufacturing costs of three-dimensional microstructures can be reduced. Further, as the spatial light modulator is employed, a mask may not be used. Further, while an existing optofluidic lithography system using a mask can produce only microstructures with a predetermined shape, the optofluidic lithography system shown in FIG. 1 can produce microstructures having various shapes without the replacement of a mask. Further, the optofluidic lithography system shown in FIG. 1 makes it possible to control in-situ photopolymerization in real time.

Figure 2:
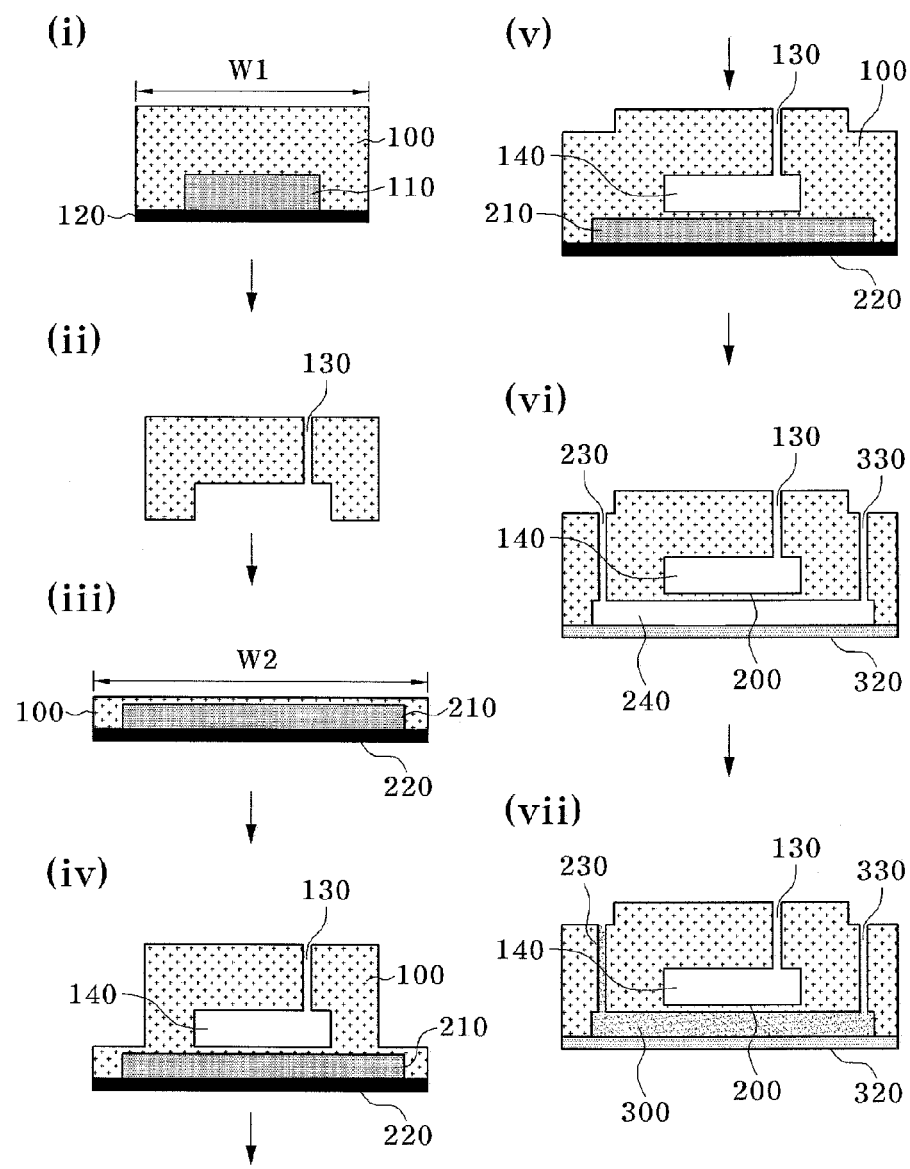
FIG. 2 is a diagram for explaining a method of manufacturing a two-layered microfluidic channel according to an exemplary embodiment of this disclosure.

FIG. 2 is a diagram for explaining a method of manufacturing a two-layered microfluidic channel according to an exemplary embodiment of this disclosure.

Referring to operation (i) of FIG. 2, a first mold 110 is placed on a wafer 120, and PDMS 100 is poured into the first mold 110. The first mold 110 is used for forming a pneumatic chamber. The wafer 120 may be a silicon wafer, for example. Referring to operation (ii) of FIG. 2, the wafer 120 and the first mold 110 are removed. To insert a tube through which air can be injected into or discharged from a pneumatic chamber, a hole 130 is bored through the PDMS. Referring to operation (iii) of FIG. 2, a second mold 210 is placed on a wafer 220, and PDMS 100 is poured into the second mold 210. The second mold 210 is used for forming a microfluidic channel. Referring to operation (iv) of FIG. 2, the intermediate product having gone through operation (ii) of FIG. 2 is placed on the intermediate product having gone through operation (iii) of FIG. 2, and both of the PDMS 100 are attached to each other to form a pneumatic chamber 140. Before both of the PDMS 100 are attached to each other, both of the PDMS 100 are surface-treated by oxygen plasma or a corona discharger. Then, both of the PDMS 100 are attached to each other and sealed by application of heat. Referring to operation (v) of FIG. 2, PDMS is additionally poured onto the PDMS covering the second mold for a microfluidic channel such that the PDMS becomes thick. When the width W1 of the PDMS in operation (i) of FIG. 2 is larger than the width W2 of the PDMS in operation (iii) of FIG. 2, operation (v) may be omitted. Referring to operation (vi) of FIG. 2, the second mold 210 is removed. To insert a fluid injection tube and a fluid discharge tube through which a fluid can be injected into and discharged from the microfluidic channel, holes 230 and 330 are bored through the PDMS. The wafer 220 is removed, and a light transmitting substrate 320 is attached. Then, a microfluidic channel 240 is formed, into which a fluid is injected. The light transmitting substrate 320 may be a glass substrate, for example. Referring to operation (vii) of FIG. 2, a fluid 300 is injected into the microfluidic channel 240 through the fluid injection tube. Between the pneumatic chamber and the microfluidic channel, a membrane 200 is provided. The membrane 200 is deformed, depending on the atmospheric pressure of the pneumatic chamber 140, to determine the height of the microfluidic channel 240. The thickness of the membrane is about 200 μm.

Figure 3A:
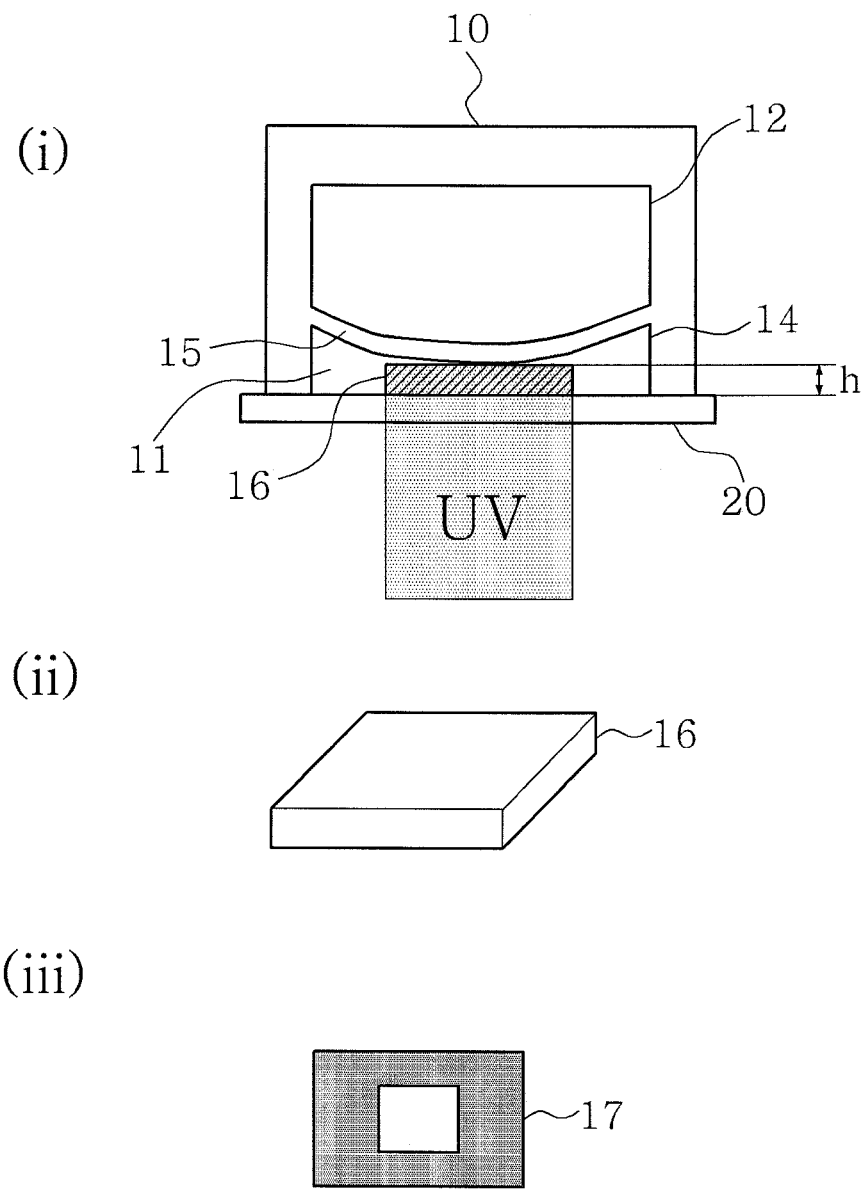
FIGS. 3A to 3C are diagrams for explaining a method of manufacturing three-dimensional microstructures using the optofluidic lithography system according to an exemplary embodiment of this disclosure.
Figure 3B:
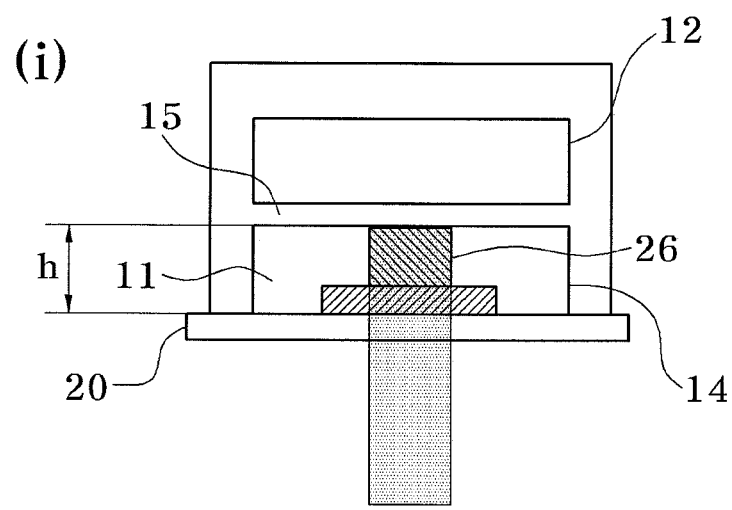
Figure 3B:
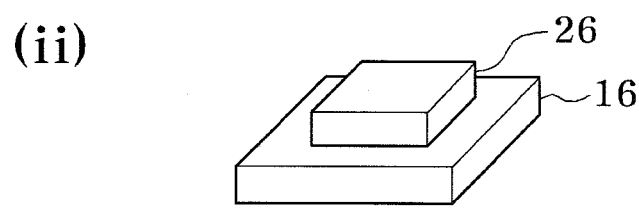
Figure 3B:
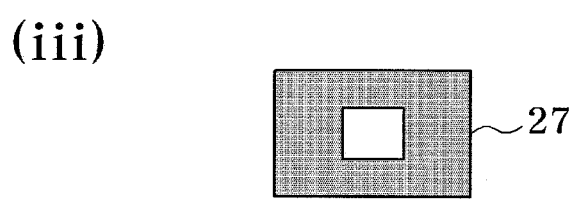
Figure 3C:
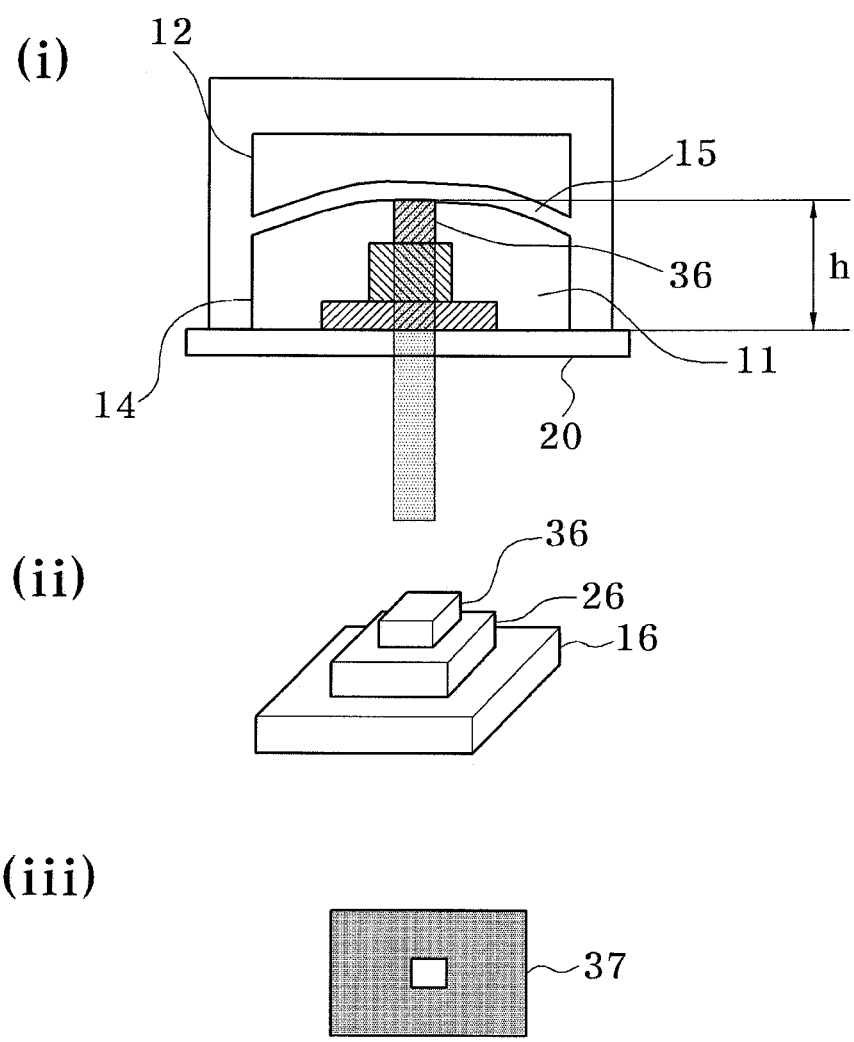

FIGS. 3A to 3C are diagrams for explaining a method of manufacturing three-dimensional microstructures using the optofluidic lithography system according to an exemplary embodiment of this disclosure. Referring to FIG. 3A (i), air is injected into the pneumatic chamber 12 such that the internal atmospheric pressure thereof increases. As the internal atmospheric pressure of the pneumatic chamber 12 increases, the membrane 15 formed between the pneumatic chamber 12 and the microfluidic channel 14 is swollen toward the microfluidic channel 14. A distance from the lowermost point of the membrane 15 and the bottom of the microfluidic channel 14 corresponds to the height h of the microfluidic channel 14. Inside the microfluidic channel 14, a fluid 11 flows. Light is irradiated through the lower surface of the substrate 20 under the microfluidic channel 14. The fluid 11 exposed to the light inside the microfluidic channel 14 is cured to form a first layer on the substrate 20. The first layer is grown up to the height h of the microfluidic channel 14. FIG. 3A (ii) illustrates the first layer 16 of the fluid 11 cured through the exposure to light. FIG. 3A (iii) illustrates the shape of the light irradiated through the lower surface of the substrate 20. The shape of the irradiated light is adjusted so as to correspond to a desired shape of the first layer. The size of the irradiated light is adjusted by the demagnification lens, and the shape of the irradiated light is controlled by the spatial light modulator.

Referring to FIG. 3B (i), air is discharged from the pneumatic chamber 12 of FIG. 3A such that the internal atmospheric pressure thereof decreases. The membrane 15 disposed lower position of pneumatic chamber 12 ascends toward the pneumatic chamber 12. The height h of the microfluidic channel 14 increases in comparison with that of FIG. 3A. Then, light is irradiated through the lower surface of the substrate 20 under the microfluidic channel 14. The fluid 11 exposed to the light inside the microfluidic channel 14 is cured to form a second layer on the first layer. The height of the second layer is obtained by subtracting the height of the first layer from the height h of the microfluidic channel 14. FIG. 3B (ii) illustrates the first layer and the second layer 26 formed on the first layer. FIG. 3B (iii) illustrates the shape of light irradiated through the lower surface of the substrate 20. The shape of the irradiated light is adjusted so as to correspond to a desired shape of the second layer.

Referring to FIG. 3C (i), air is discharged from the pneumatic chamber 12 of FIG. 3B such that the internal atmospheric pressure thereof decreases. Then, the membrane 15 under the pneumatic chamber 12 is swollen toward the pneumatic chamber 12. The height h of the microfluidic channel 14 corresponds to a distance from the bottom of the microfluidic channel 14 to the uppermost point of the membrane 15, and increases in comparison with that of FIG. 3B. Then, light is irradiated through the lower surface of the substrate 20 under the microfluidic channel 14. The fluid 11 exposed to the light inside the microfluidic channel 14 is cured to form a third layer on the second layer. The height of the third layer is obtained by subtracting the heights of the first and second layers from the height h of the microfluidic channel 14. FIG. 3C (ii) illustrates the first layer 16, the second layer 26, and the third layer 36 formed on the second layer. FIG. 3C (iii) illustrates the shape of the light irradiated through the lower surface of the substrate 20. The shape of the irradiated light is adjusted so as to correspond to a desired shape of the third layer. The exposure time of the light irradiated to the microfluidic channel through the substrate differs depending on the intensity of the light source, but ranges from 0.1 to 0.2 seconds.

Figure 4:
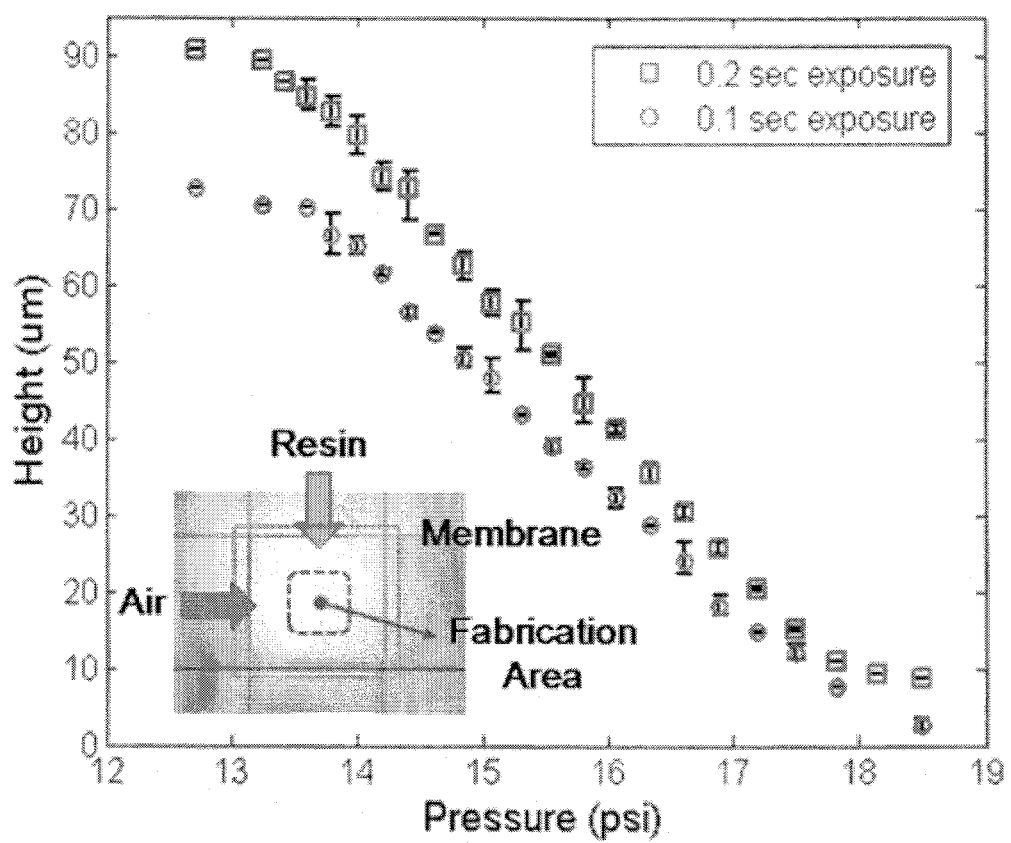
FIG. 4 is a graph showing correlations among the internal atmospheric pressure of a pneumatic chamber, the exposure time of ultraviolet light, and the height of a layer formed in a microfluidic channel.

FIG. 4 is a graph showing the height of a layer formed by the cure of the photocurable fluid inside the microfluidic channel, depending on the internal atmospheric pressure of the pneumatic chamber. Referring to FIG. 4, the height of the layer changes linearly depending on the internal atmospheric pressure of the pneumatic chamber. Further, the height of the microfluidic channel may not change because of an identical internal atmospheric pressure of the pneumatic chamber. In this case, when the exposure time of ultraviolet light lengthens, polymerization additionally occurs in an oxygen inhibition layer around the membrane. Therefore, although the internal atmospheric pressure of the pneumatic chamber is identical, the height of the layer may increase when the exposure time of ultraviolet light lengthens.

Figure 5:
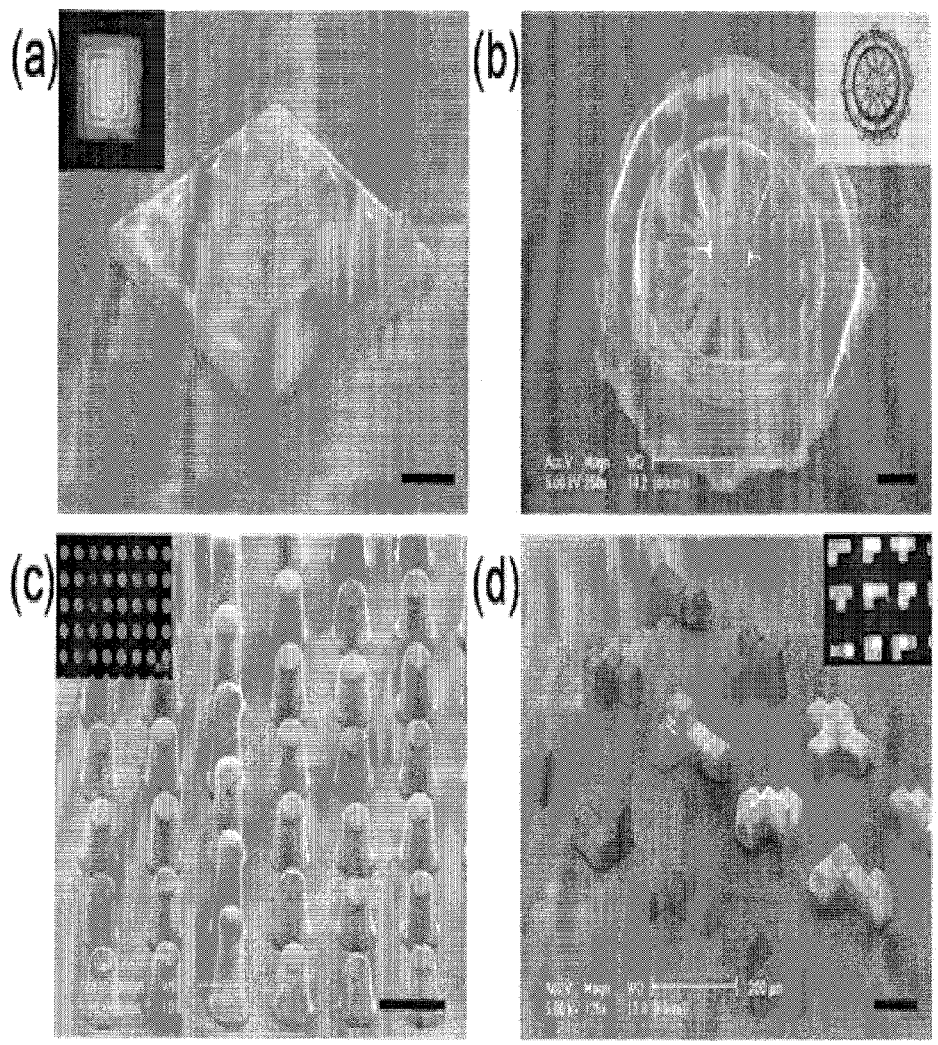
FIGS. 5A to 5D are scanning electron microscope (SEM) photographs showing various three-dimensional structures manufactured by the method of FIG. 2.

FIGS. 5A to 5D are scanning electron microscope (SEM) photographs showing various three-dimensional structures manufactured by the above-described method. FIG. 5A shows a microstructure formed in a five-layered pyramid shape. FIG. 5B shows a five-layered minute-wheel structure. FIG. 5C shows a structure in which posts having various heights are arranged in a lattice shape. FIG. 5D shows various microstructures which are uniformly arranged in a two-dimensional manner. As such, it is possible to manufacture the three-dimensional microstructures having complex shapes through the method of manufacturing three-dimensional microstructures according to this disclosure. Scale bars on the photographs indicate 50 μM, but a scale bar of FIG. 5D exceptionally indicates 100 μm.

Figure 6A:
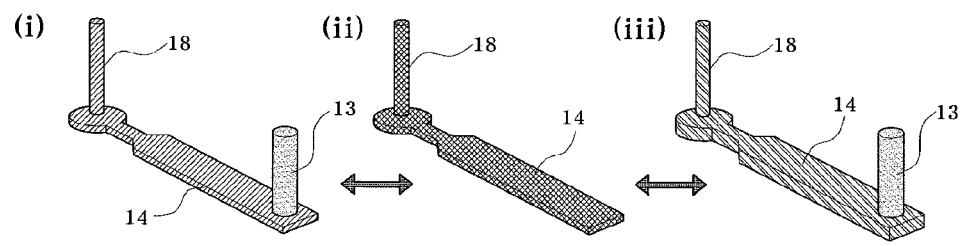
FIGS. 6A and 6B are diagrams for explaining methods of manufacturing three-dimensional microstructures by injecting different kinds of fluids into a two-layered microfluidic channel according to an exemplary embodiment.
Figure 6B:
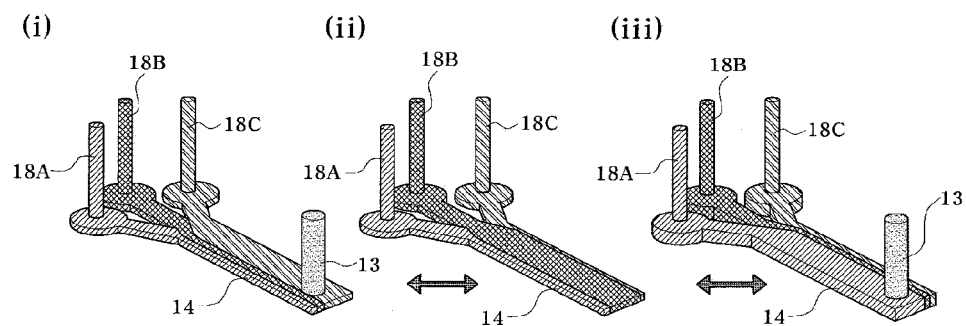

FIGS. 6A and 6B are diagrams for explaining methods of manufacturing three-dimensional microstructures by injecting different kinds of fluids into a two-layered microfluidic channel according to an exemplary embodiment. Referring to FIG. 6A, while flowing a material A into the microfluidic channel 14 through the fluid injection tube 18, light 13 is irradiated to cure the material A into a desired shape (operation (i)). The light may be X-ray, ultraviolet light, visible light, or infrared light, for example. A cleaning solution is flowed into the microfluidic channel 14 through the fluid injection tube 18 to wash out the remaining material A (operation (ii)). The cleaning solution may be ethanol or deionized water. While flowing a material B into the microfluidic channel 14 through the fluid injection tube 18, light 13 is irradiated onto the material B to cure the material B into a desired shape on the material A cured in operation (i) (operation (iii)). The above-described process may be performed in reverse order. Referring to FIG. 6B, a two-layered microfluidic channel according to an exemplary embodiment of this disclosure includes a plurality of fluid injection tubes. While flowing a material A into the microfluidic channel 14 through one fluid injection tube 18A, light 13 is irradiated to cure the material A into a desired shape (operation (i)). The light may be X-ray, ultraviolet light, visible light, or infrared light, for example. A cleaning solution is flowed into the microfluidic channel 14 through another fluid injection tube 18B to wash out the remaining material A (operation (ii)). The cleaning solution may be ethanol or deionized water. While flowing a material B into the microfluidic channel 14 through another fluid injection tube 18C, light 13 is irradiated onto the material B to cure the material B into a desired shape on the material A cured in operation (i) (operation (iii)). The above-described process may be performed in reverse order. As described above, it is possible to manufacture three-dimensional microstructures composed of different materials using the two-layered microfluidic channel according to this disclosure.

Figure 7:
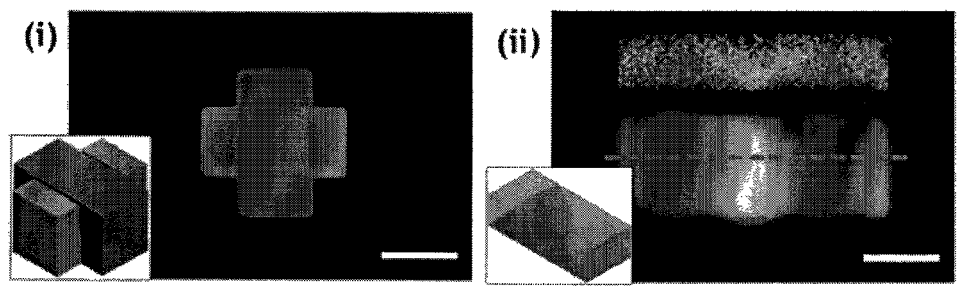
FIG. 7 is a photograph showing three-dimensional structures manufactured by the method of FIG. 6A or 6B.

FIG. 7 (i) and (ii) are photographs showing three-dimensional microstructures manufactured by the method of FIG. 6A or 6B. Referring to FIG. 7 (i), structures composed of two kinds of materials are stacked in a vertical direction. A small drawing on the lower left-hand side of FIG. 7 (i) is a perspective view of the structure. Referring to FIG. 7 (ii), pyramid-shaped structures are placed at the bottom, and another structure formed of a different material is stacked on the pyramid-shaped structures. As a whole, the structures form a rectangular parallelepiped shape. A small drawing on the lower left-hand side of FIG. 7 (ii) is a perspective view of the structures. Scale bars in the right bottom side of FIG. 7 (i) and (ii) indicate 100 μm.

Figure 8:
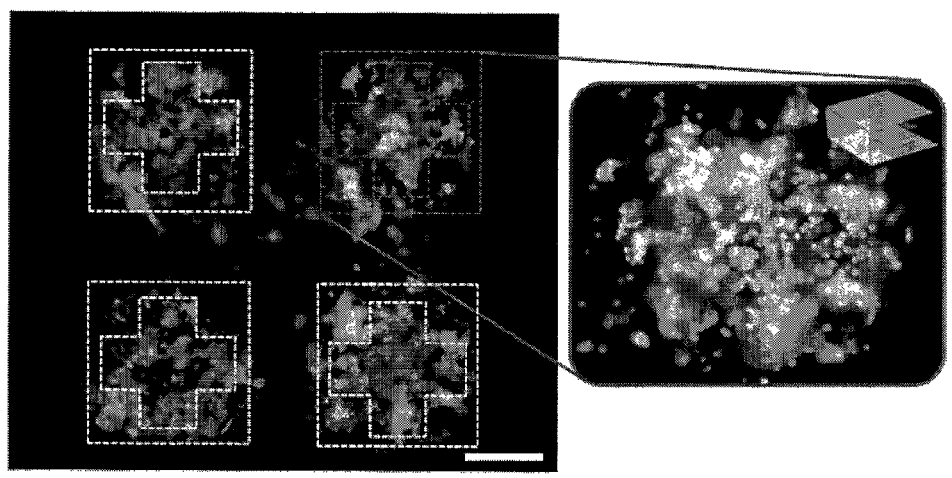
FIG. 8 is a photograph showing an array of patterned hydrogels including different living cells, manufactured by the method of FIG. 6A or 6B.

FIG. 8 is a photograph showing arrangements of patterned hydrogels including different living cells, manufactured by the method of FIG. 6A or 6B according to an exemplary embodiment of this disclosure. When the method of manufacturing three-dimensional microstructures according to this disclosure is used, it is possible to manufacture microstructures such as three-dimensional hydrogel structures of which each portion includes different living cells. Referring to FIG. 8, different living cells are dyed with different fluorescent materials. A first layer (orange) is formed in a cross shape, and a second layer (green) is formed in a square shape. A photograph shown on the right is obtained by magnifying one of the arrangements of the photograph on the left. A scale bar in the photograph on the left indicates 100 μm. As such, when the method of manufacturing three-dimensional microstructures according to this disclosure is used, it is possible to manufacture a structure of which each portion is composed of different materials and includes different living cells.

The foregoing is illustrative of the present disclosure and not to be construed as limiting thereof. Although numerous embodiments of the present disclosure have been described, those skilled in the art will readily appreciate that many modifications are possible in the embodiments without materially departing from the novel teachings and advantages of the present disclosure. Accordingly, all such modifications are intended to be included within the scope of the present disclosure as defined in the claims. Therefore, it is to be understood that the foregoing is illustrative of the present disclosure which is not to be construed as limited to the specific embodiments disclosed, and that modifications to the disclosed embodiments, as well as other embodiments, are intended to be included within the scope of the appended claims. The present disclosure is defined by the following claims, with equivalents of the claims to be included therein.

What is claimed is:

1. An optofluidic lithography system comprising:
   a membrane;
   a pneumatic chamber, the pneumatic chamber configured to induce a displacement of the membrane depending on an internal atmospheric pressure thereof; and
   a microfluidic channel adjacent to the membrane and outside the pneumatic chamber, the microfluidic channel having a height corresponding to the displacement of the membrane and having a fluid flowing therein, the fluid being cured by light irradiated from a bottom of the microfluidic channel to form a microstructure,
   wherein the pneumatic chamber is positioned above the microfluidic channel to displace the membrane forming a bottom surface of the pneumatic chamber and a top surface of the microfluidic channel such that the height of the microfluidic channel is adjusted by the displacement of the membrane,
   wherein a height of the microstructure is determined by the displacement of the membrane.

2. The optofluidic lithography system according to claim 1, wherein the membrane is formed of polydimethylsiloxane.

3. The optofluidic lithography system according to claim 1, wherein the fluid is photocurable.

4. The optofluidic lithography system according to claim 1, wherein the pneumatic chamber is connected to an air injection pump capable of introducing air to and discharging air from the pneumatic chamber.

5. The optofluidic lithography system according to claim 1 further comprising:
- an injection tube through which the fluid is injected into the microfluidic channel; and
- a discharge tube through which the fluid is discharged from the microfluidic channel.

6. The optofluidic lithography system according to claim 1, further comprising:
- a light source configured to generate light capable of curing the fluid flowing in the microfluidic channel; and
- a spatial light modulator configured to modulate the light provided from the light source.

\* \* \* \* \*